V.H.F. AND U.H.F. TUNING MEANS

Filed May 12, 1965 3 Sheets-Sheet 1

INVENTOR.
FRANK T. HIATT

BY [signature]

ATTORNEY

Nov. 15, 1966 F. T. HIATT 3,286,209

V.H.F. AND U.H.F. TUNING MEANS

Filed May 12, 1965 3 Sheets-Sheet 2

INVENTOR.
FRANK T. HIATT
BY Robert Lennie
ATTORNEY

V.H.F. AND U.H.F. TUNING MEANS

Filed May 12, 1965 3 Sheets-Sheet 3

INVENTOR.
FRANK T. HIATT
BY Robert Jennie
ATTORNEY

United States Patent Office 3,286,209 Patented Nov. 15, 1966

3,286,209
V.H.F. and U.H.F. TUNING MEANS

Frank T. Hiatt, Indianapolis, Ind., assignor to P. R. Mallory & Co., Inc., Indianapolis, Ind., a corporation of Delaware Filed May 12, 1965, Ser. No. 455,170
12 Claims. (Cl. 334—43)

The present invention relates to an electromagnetic energy tuning device continuously operative over a wide range of frequencies for tuning receiving circuits. More particularly, the invention pertains to a continuous tuning means that utilizes a transmission line that is tunable in the V.H.F., very high frequency range, and/or in the U.H.F., ultra high frequency range.

The trend toward the use of miniaturized electronic elements such as transistors, electronic tubes, resistors, and capacitors in conjunction with the use of printed circuit boards in tunable electronic devices has made it necessary to reduce the physical dimensions of cooperatively associated tuning means and apparatus so as to allow the effective use of the tuning means in miniaturized electrical circuitry. In conventional television receivers using V.H.F. and U.H.F. tuning means, generally the tuning means is comprised of two separate and distinct tuners that are physically separated by a determined distance. The space requirement for the aforementioned arrangement is prohibitive. In addition, inefficiencies result from the losses because of the use of relatively long electrical connections between the cooperatively associated tuning means.

The continuous tuning means of the present invention offers the capability of continuous tuning in the V.H.F. and/or in the U.H.F. frequency ranges by the means and methods of the utilization of a transmission line contained within a relatively small package. The means of the present invention offers the advantage of a low cost approach to V.H.F. and U.H.F. tuning with the equivalent performance of so-called cavity tuners.

Therefore, it is an object of the present invention to provide a V.H.F. and/or U.H.F. tuning means which requires substantially no more physical space than is required by the conventional V.H.F. means.

Another object of the present invention is to provide a V.H.F. and/or U.H.F. tuning means of the vernier type for tunable circuits responsive to high frequency electromagnetic waves.

A further object of the present invention is to provide a compact V.H.F. and/or U.H.F. tuning means for linearly tuning tunable circuitry.

Yet another object of the present invention is to provide a V.H.F. and/or U.H.F. tuning means that has a Q factor of about 1000.

Still another object of the present invention is to provide a V.H.F. and/or U.H.F. tuning means which is rugged and dependable, yet compact and inexpensive.

Another object of the present invention is to provide a V.H.F. and/or U.H.F. tuning means that may be tuned or varied over a frequency ratio of at least 2 to 1.

Yet still another object of the present invention is to provide a V.H.F. and/or U.H.F. tuning means having a specific frequency versus rotation curve thereby having the advantage that the transmission line contained within the means may be tapered, contoured, or varied in spacing to permit flexibility in designing the tuning means around other electrically associated means.

Still another object of the present invention is to provide trimming and coupling means incorporated into the V.H.F. and U.H.F. tuning means for fine tuning the cooperatively associated tunable circuitry.

Yet another object of the present invention is to provide a V.H.F. and U.H.F. tuning means including a means and method whereby a plurality of said tuning means may be ganged so as to afford simultaneous tuning or tunable circuitry.

Another object of the present invention is to provide a V.H.F. and U.H.F. tuning means having a novel arrangement, organization, and interconnection of components cooperating in such a way so as to provide a tuning mechanism with improved operating characteristics.

Still another object of the present invention is to provide a V.H.F. and U.H.F. tuning means having optimum reliability characteristics afforded by compact construction having a minimum number of components.

The present invention in another of its aspects relates to novel features of the instrumentalities of the invention described herein for teaching the principal object of the invention and to the novel principles employed in the instrumentalities whether or not these features and principles may be used in the said object and/or in the said field.

With the aforementioned objects enumerated, other objects will be apparent to those persons possessing ordinary skill in the art. Other objects will appear in the following description, appended claims, and appended drawings. The invention resides in the novel construction, combination, arrangement, and cooperation of elements as hereinafter described and more particularly as defined in the appended claims.

The appended drawings illustrate the preferred embodiment of the present invention constructed to function in the most advantageous modes devised for the practical application of the basic principles involved in the hereinafter described invention.

Figures 1, 2:
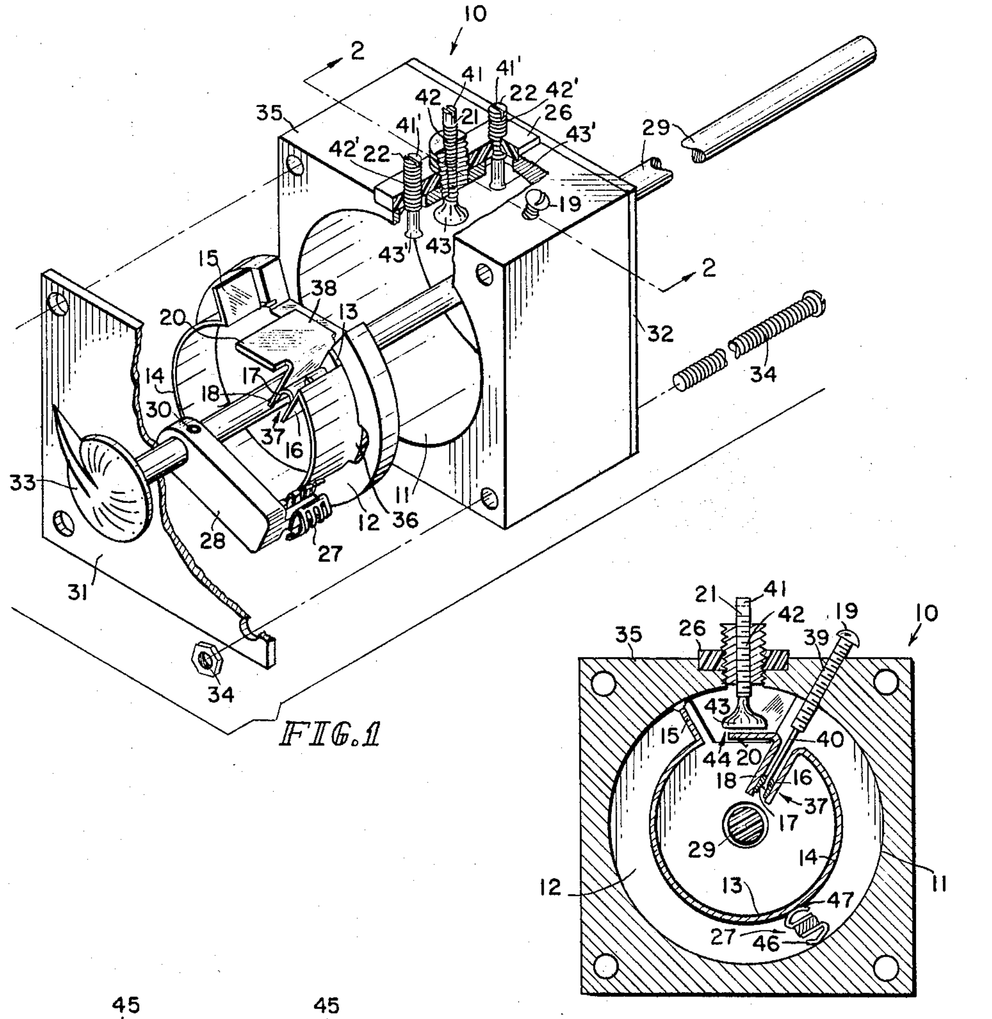
FIGURE 1 is an exploded perspective view of the V.H.F. and U.H.F. tuning means of the present invention illustrating various components and their respective cooperative location each with respect to the other.
FIGURE 2 is a cross-sectional view of the present invention taken across the line 2—2 of FIGURE 1 illustrating the cooperative relationship between a transmission line, a displaceable nib, and a trimming means.
Figure 3:
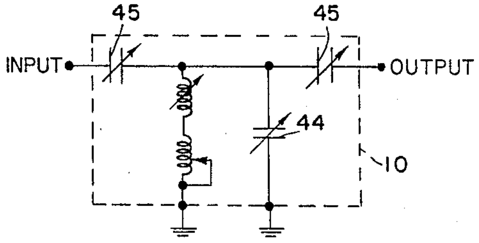
FIGURE 3 is an electrical schematic diagram of the present invention illustrated in FIGURES 1 and 2.

Generally speaking, the means and methods of the present invention relate to a novel tuning means for continuously tuning tunable circuits capable of operating in a plurality of frequency bands.

The tuning means comprises a housing that includes an axial bore. A circular-shaped guide means includes an arcuate groove and is predeterminately located within the bore. A transmission line of predetermined electrical length is retained by the arcuate groove of the guide means. The transmission line has a first tab electrically coupled to the housing of the tuning means. A rotatable means is coupled to a nib means so that rotational displacement of the rotatable means causes rotational displacement of the nib means. The nib means includes a contact means riding between and engaging the transmission line and the surface of the bore. As a result thereof, the nib means electrically couples the transmission line to the bore and the rotational displacement of the nib means varies the electrical length of the transmission line thereby coarse tuning the tuning means when the tuning means is used to tune low frequencies. A trimmer capacitor is used for varying the capacitance of the tuning means thereby fine tuning the means at high frequencies. A plurality of variable coupling capacitors are used to couple said tuning means to a tunable circuit.

More particularly, the present invention pertains to a tuning means that provides continuous and accurate tuning in the V.H.F. and/or in the U.H.F. frequency bands. The means has a housing that includes an axial bore. A circular guide means is predeterminately positioned within the bore. The guide means includes an arcuate groove cut therein. An arcuately shaped transmission line of predetermined electrical length has an edge retained within the arcuate groove of the guide means. The transmission line includes a first tab that is formed so as to be perpendicular to the periphery of the transmission line. The first tab is electrically coupled to the housing of the tuning mechanism. A rotatable means is coupled to a nib means in such a manner that the rotatable means is used to rotatably displace the nib means. The nib means includes a contact means riding between and engaging both the transmission line and the surface of the bore. The nib means electrically connects the transmission line to the bore. Rotational displacement of the nib means varies the electrical length of the transmission line thereby coarse tuning the tuning means in either the V.H.F. or the U.H.F. frequency bands. An inductor assembly includes a second tab of the transmission line and the inductor tab portion of a V-shaped means. The second tab and the inductor tab are in spaced, parallel relationship. A U-shaped shorting bar slidably engages the tabs in spaced parallel relationship. A means is coupled to the U-shaped means for slidably displacing the U-shaped shorting bar to thereby fine tune the tuning means when the tuning means is coarse tuned at the lower frequencies. A trimmer capacitor means includes a stator portion of the V-shaped means and a vertically displaceable rod having a flat head portion. The head portion of the rod means overlays the stator plate in such a manner that vertical displacement of the rod causes the capacitance of the trimmer capacitor to vary thereby fine tuning the tuning means when the tuning means is coarse tuned to the higher frequencies. A plurality of coupling capacitors are used to match impedances between the tuning means and the tunable circuits or load.

In an embodiment of the present invention an arcuately shaped transmission line of predetermined electrical length is used, the transmission line including two concentric transmission line sections. A rotatable means is coupled to a nib means, the rotatable means is used for rotationally displacing the nib means. The nib means is positioned between and electrically couples the two concentric sections of the transmission line. Rotational displacement of the nib means varies the electrical length of the transmission line thereby coarse tuning the tuning means within the V.H.F. or the U.H.F. frequency bands. A trimmer capacitor includes a vertically displaceable rod having a head portion fixedly coupled to one of the concentric sections of the transmission line. Vertical displacement of the rod causes a similar vertical displacement of the concentric section of the transmission to which the rod is connected. It is seen that the one concentric section is displaced with respect to the other concentric section thereby varying the capacitance of the trimmer capacitor so as to fine tune the coarse tuned tuning means. A plurality of variable coupling capacitors couple the tuning means to a tunable circuit. Also, the coupling capacitors are used for matching the impedances between the tuning means and the tunable circuit.

Referring now to the drawings, which illustrate the preferred embodiments of the present invention, the V.H.F. and U.H.F. tuning means is generally indicated by numeral 10. A housing 35 serves as the main structural member of the tuning means. The housing may be fabricated from any suitable, structurally strong material such as metal or the like. Axially formed within the housing is a cylindrical bore 11. Interfitting with bore 11 is disposed guide member 12 composed of any suitable insulating material such as Rexolite or the like. The guide member is securely affixed to the cylindrical surfaces of the bore by any suitable means such as glue or the like.

Guide member 12 has cut therein an arcuate groove 13 having a radius less than the radius of the guide member. An arcuately shaped transmission line 14 has an edge 36 that is press fitted into groove 13 of the guide member. One extremity of the transmission line includes a tab 15 that is formed at substantially a right angle with the circumference of the transmission line and projects outwardly from the axis of the transmission line. The tab 15 is fixedly coupled to the housing by any suitable retaining means such as by rivets, solder, welds or the like. The opposite extremity of the transmission line forms tab 16 which is formed at substantially a right angle with the circumference of the transmission line and projects inwardly toward the axis of the transmission line. Tab 16 is an integral part of inductor assembly 37. The inductor assembly also includes an inductor tab 17 which is substantially identical in shape and size as tab 16. Tab 16 and tab 17 are fabricated from any suitable material such as silver plated copper or the like. It is seen that inductor tab 17 is in spaced, parallel relationship with tab 16 of the transmission line. A substantially U-shaped shorting bar 18 is positioned between the spaced, parallel tabs in such a manner that shorting bar 18 wipes the parallel faces of the tabs as the shorting bar is displaced. The shorting bar is coupled to a threaded insulated rod 19 of predetermined length which mates with and projects through a threaded aperture 39 in the housing. It will be noted that the axis of insulated rod if projected sufficiently would pass through the axis of the transmission line. An axial arm 40 integral with and projecting from the extremity of the threaded rod is fixedly coupled to the shorting bar by any suitable means such as by press fitting, welding, soldering or the like. It is seen that radial adjustment of the shorting bar with respect to the spaced, parallel tabs is accomplished by turning the threaded rod into or out of the threaded aperture. Turning the threaded rod into the aperture radially displaces the shorting bar toward the axis of the transmission line whereas turning the threaded rod out of the aperture radially displaces the shorting bar away from the axis of the transmission. The movement of the shorting bar along the longitudinal axis of the spaced, parallel tabs permits fine frequency adjustments to be made by the V.H.F. and U.H.F. tuning means. Generally, the inductor assembly is utilized to fine tune the V.H.F and U.H.F. tuning means when the tuning means is coarse tuned to the lower frequencies.

With continued reference to FIGURE 1 and FIGURE 2, more particularly with respect to the V-shaped means 38, forming an integral part of the V-shaped means is stator plate 20, it is seen that the stator plate is disposed at an acute angle with respect to the inductor tab 17. The stator plate is a substantially flat member which underlies and is parallel to a trimmer rod 21 and a plurality of coupling rods 2. The trimmer rod 21 is comprised of a slotted extremity 41, a threaded portion 42, and a head portion 43. Each of the plurality of coupling rods is comprised of a slotted extremity 41', a threaded portion 42', and a head portion 43'. It will be noted that each of the head portions 43 and 43' include a flat surface area that is in spaced, parallel relationship with respect to the stator plate 20. The electrical cooperation between head portion 43 of the trimmer rod and the stator plate form a trimmer capacitor 44 and the electrical cooperation between the head portions 43' of the plurality of coupling rods 22 and the stator plate form a plurality of coupling capacitors 45. It is noted that head portion 43 of the trimmer rod has a large surface area and functions as the rotor plate of the capacitor 44.

The respective rods 21 and 22 project through the housing in such a manner that the slotted extremity of each of the several rods is externally located. The threaded portion of each of the aforementioned rods interfits with threaded aperatures in the housing. It is seen that as the threaded trimming rod is turned into the threaded aperture that the head portion of said rod will be displaced toward the surface of the stator plate and that as the threaded trimming rod is turned out of the threaded aperture that the head portion of said rod will be displaced away from the surface of the stator plate. Vertical displacement of the trimmer rod causes the capacitance of capacitor 44 to vary accordingly. Generally, the trimmer capacitor is utilized to fine tune the V.H.F. and U.H.F. tuning means when the tuning means is coarse tuned to the higher frequencies.

To afford input and output coupling to the V.H.F and U.H.F. tuning means and to provide a means for matching impedances between the tuning means and a load, a plurality of coupling capacitors 22 is provided. The flared head portion 43' of each of the coupling rods serves as the rotor plate which cooperates with stator plate 20 so as to form a coupling capacitor 22. The capacitance of the coupling capacitors is made variable by turning the appropriate coupling rods into or out of its mating aperture. It is noted that the coupling rods are electrically insulated from the metallic housing by insulating board 26. The input and output connections for the coupling capacitors are made directly to the coupling rods by any suitable means such as a clip means (not shown) or the like.

A nib 27 is attached to an electrically non-conductive arm 28 which in turn is fixedly coupled to a rotatable shaft 29 by any suitable means such as by set screw 30. The rotatable shaft 29 lies along the centerline of the V.H.F. and U.H.F. tuning means. The shaft is rotatably journalled in front plate 31 and in rear plate 32. The front and rear plates are fixedly coupled to the housing by any suitable means such as bolts and cooperating screws 34 or the like. The plates serve to seal the axial extremities of the housing thereby protecting the tuning means from abusive handling and/or deleterious agents present in the air such as moisture, dust and the like. A knob 33 is coupled to shaft 29 so as to facilitate the arcuate displacement of the shaft. The knob may have coded indicia printed thereon so as to indicate the frequency to which the tuning means is tuned.

With particular reference to the nub 27, it is seen that the nib includes a plurality of wiper arms 46 riding on the periphery of bore 11 and a plurality of wiper arms 47 riding on the surface of the arcuately shaped transmission line. The wiper construction may have any suitable construction but preferably has the construction as shown in FIGURES 1 and 2. It is seen that arcuate displacement of the shaft causes arcuate displacement of the nib which in turn varies the electrical length of the transmission line. The nib is in effect a shorting bar. Displacement of the wiper contacts of the nib to another position across the transmission line tunes the tuning means in such a manner so as to receive signals within the V.H.F. or the U.H.F. band. One terminal of the transmission line is coupled to a load such as an R.F. stage and the other terminal of the line is coupled to electrical ground.

Figure 5:
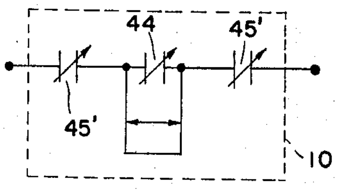
FIGURE 5 is an electrical schematic diagram of the present invention illustrated in FIGURE 4.

FIGURE 5 illustrates the electrical schematic of the mechanical means discussed in conjunction with FIGURES 1 and 2.

Figure 4:
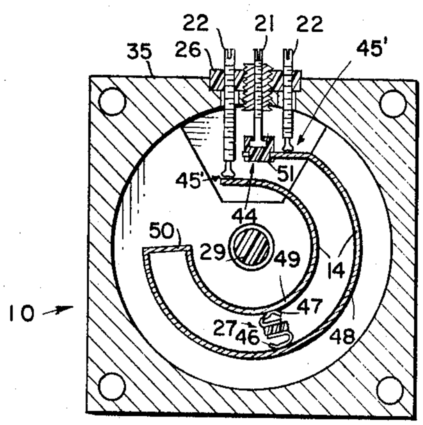
FIGURE 4 is a view in section of another embodiment of the present invention illustrating a transmission line having concentric sections and a variable trimming means used in tuning tunable circuits.

FIGURE 4 shows yet another embodiment of the present invention. A transmission line 14' consists of two concentric, arcuate sections 48 and 49 joined by a segment 50. The arcuate sections 48 and 49 are concentric about shaft 29. The pair of concentric sections have an arcuate extent of about 280 degrees with section 49 having a slightly greater arcuate length than does section 48. A nib 27 having a plurality of wiper arms 46 and 47 is coupled to shaft 29 through an electrically non-conductive arm (not shown) in the manner described hereinbefore. As the shaft is rotated thereby arcuately displacing the wiper arms, the wiper arms riding on the surface of the transmission line predeterminately vary the electrical lengths of the sections of the transmission line so as to tune the tuning means to receive a selected frequency within the V.H.F. or U.H.F. frequency range.

In the embodiment of FIGURE 4 shows that no electrical connection is made between the housing 35 and the transmission line 14'. The transmission line 14' is retained in position by a guide member (not shown) in a manner similar to the transmission line of FIGURE 1.

The trimmer capacitor 44' is connected directly to the extremity of section 48 of the transmission line 14' by insulating means 51. The extremity of the section 48 of the transmission line is displaced further from or closer to the extremity of section 49 of the transmission line thereby effectively changing the capacitance between the extremities of the two sections of the transmission line. The trimmer capacitor utilizes as a component thereof, the trimmer rod 21 which may be turned into or out of the threaded aperture of the housing so as to vertically displace the extremity of the segment 48 of the transmission line. The trimmer rod 21 is electrically coupled to the housing.

The input and output coupling capacitors 45' of this embodiment of the present invention do not have the same stator plate in common. Each of the coupling capacitors is capacitively coupled to a separate one of the concentric segments of the transmission line. Both of the coupling capacitors are constructed using a component thereof coupling rod 22 which has a large surface area extremity that is in close proximity to the cooperatively associated segment of the transmission line 14'.

Illustrated in FIGURE 5 is an electrical schematic representation of the V.H.F. and U.H.F. tuning means illustrated in FIGURE 4.

Figure 6:
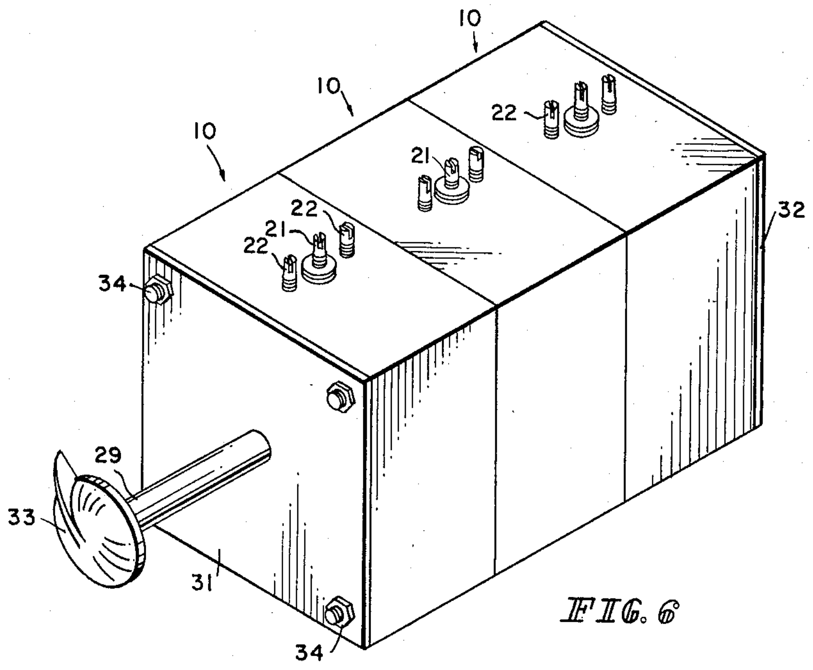
FIGURE 6 is a perspective view of the present invention wherein a plurality of the V.H.F. and U.H.F. tuning means have been ganged to provide simultaneous tuning of a plurality of tunable circuits.

FIGURE 6 shows a plurality of V.H.F. and U.H.F. tuning means that have been engaged to achieve simultaneous tuning of a plurality of tunable circuits electrically associated with the plurality of V.H.F. and U.H.F. tuning means. It is seen that rotational displacement of shaft 29 will rotationally displace each of the nibs of the plurality of tuning means thereby varying the length of each of the transmission lines of the plurality of tuning means.

Figure 7:
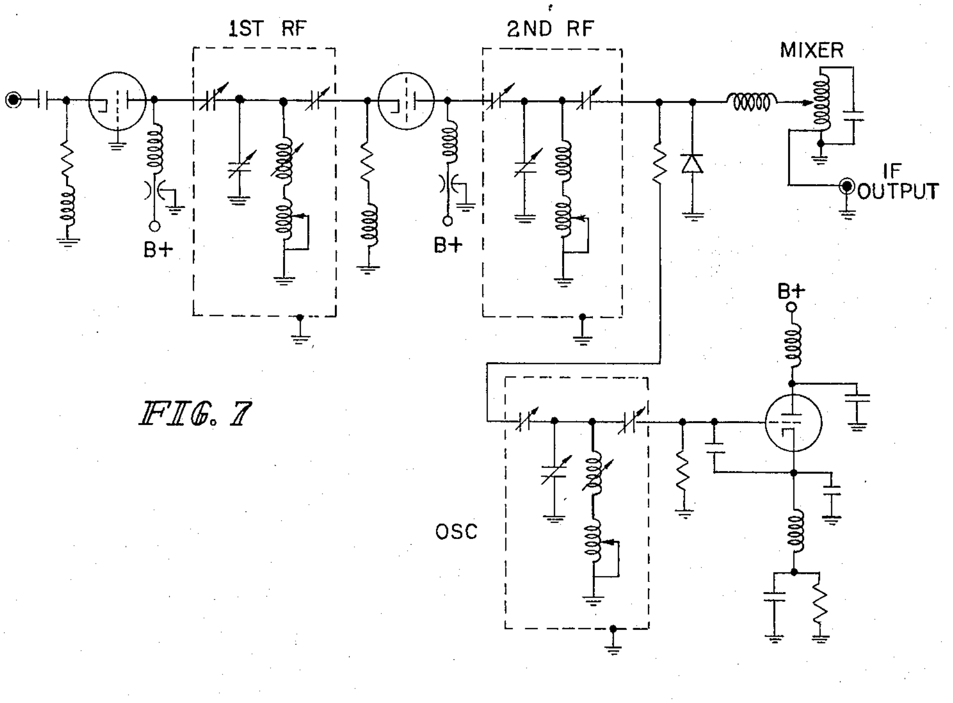
FIGURE 7 is an electrical circuit diagram showing a typical front end of a receiver utilizing this device.

FIGURE 7 is a schematic diagram showing a typical front end of a receiver utilizing the V.H.F. and U.H.F. tuning means of the present invention. As shown in FIGURE 7, three tuning means are ganged together with the tuning being accomplished by means of rotating a common shaft 29. Each of the three tuning means is indicated pictorially by means of being enclosed within a dotted line rectangle. The first tuning means is utilized to tune the shunt fed plate of an R.F. grounded grid amplifier. The output of the first tuning means is then fed to the cathode of a second R.F. grounded grid amplifier. The shunt fed plate circuit of the second R.F. amplifier contains the second V.H.F. and U.H.F. tuning means. The second V.H.F. and U.H.F. tuning means forms the resonant tank circuit for that plate. The output of the second V.H.F. and U.H.F. tuning means is then fed to a diode mixer stage.

The third V.H.F. and U.H.F. tuning means forms the resonant circuit for the Colpitts oscillator stage and is separated from the R.F. stages by the I.F. frequency. The output of this oscillator stage is then fed to the diode mixer stage where mixing between the R.F. frequencies and the oscillator frequency is achieved. The output of the mixer stage being tuned to the selected I.F. frequency.

Figure 8:
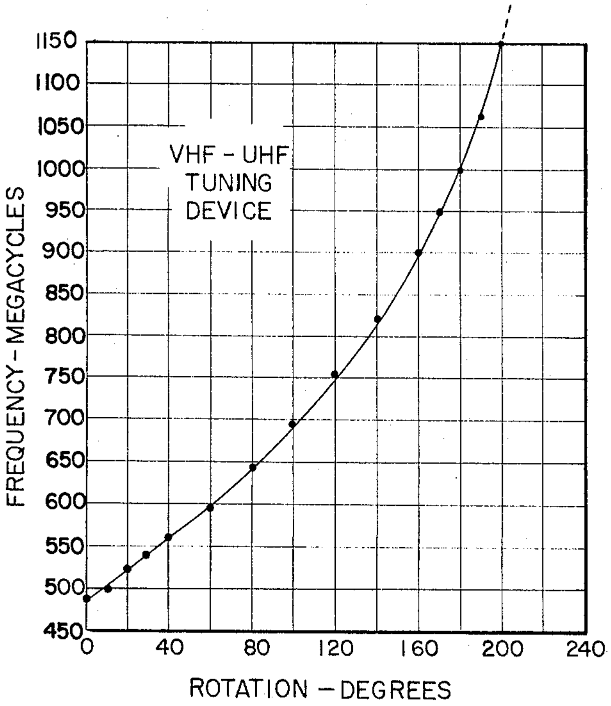
FIGURE 8 illustrates the frequency versus rotational displacement curve for the V.H.F. and U.H.F. tuning means of the present invention.

A typical frequency versus rotation curve is illustrated in FIGURE 8. Total rotation of the device used for this curve was 240 degrees. The minimum frequency received was 490 megacycles and the maximum frequency received was 1150 megacycles thereby affording a tuning ratio of approximately 2.35 to 1.

Having described the structure of the present invention, the cooperation between the described structural elements will be disclosed.

The tuning of the V.H.F. and U.H.F. tuning means is accomplished by the sliding action of the contacts of a nib which shorts the transmission line to the housing as shown in FIGURE 1, or in the embodiment of FIGURE 4 shorts the concentric segments together at various locations on the concentric segments. By shorting out the transmission lines at various locations, the electrical length or inductance of the transmission line is varied thereby changing the resonant frequency of the V.H.F. and U.H.F. tuning means.

The drive, which is used to actuate the sliding contact, is achieved through the use of a suitable linkage in the form of an electrically non-conductive arm 28 which is connected to the shaft of the tuning means. The shaft is rotated manually in the clockwise direction or counterclockwise direction to accomplish the desired tuning of the tuning means.

To attain the high Q, hereinbefore disclosed, and for end point alignment, a trimmer capacitor 44 is made an integral part of the tuning means. By displacing the head portion 43 of the trimmer capacitor into close proximity to the transmission line, the capacitance between the transmission line and the housing may be utilized to vary the resonant frequency of the tuning means. In the embodiment illustrated in FIGURE 4, the trimmer rod is coupled directly to the extremity of one segment of the transmission line, but insulated therefrom. Vertical displacement of the trimmer rod is utilized to vary spacing between the extremities of segments of the transmission line to thereby vary the capacitance between the segments of the transmission line. The variance of the capacitance is used to vary the resonant frequency of the tuning device to a desired resonant frequency.

A further fine resonant frequency adjustment of the tuning means is accomplished through the use of inductor assembly 37 which is constructed as an integral part of the transmission line. The inductor assembly utilizes two tabs that are in spaced, parallel relationship having substantially the same width as the width of the transmission line. A shorting bar 18 is moved between the two tabs to afford a small inductance change as compared to the total inductance of the transmission line. The adjustment by the inductor assembly is achieved by the turning into or the turning out of the housing the threaded rod 19 so as to vary the location of shorting bar 18 on the tabs.

The input and the output coupling to the V.H.F. and U.H.F. tuning means is achieved by capacitively coupling the transmission line through the use of a plurality of threaded rods 22 which are turned into or out of an insulative block in the housing and which electrically insulate the plurality of rods from the housing. The head portion 43' of each of the rods effectively act as rotors while the cooperatively associated transmission line acts as the stator. In the embodiment of FIGURE 4, the coupling capacitors are formed on separate concentric sections of the transmission line.

The housing of the V.H.F and U.H.F. tuning means is utilized to achieve optimum shielding of the transmission line. The physical dimensions of the case and of the transmission line are designed to obtain optimum Q factor while still providing the facility of ganging more than one of the tuning means to a common shaft.

While the invention is illustrated and described in its preferred embodiment, it will be understood that modifications and variations may be effected without departing from the scope of the novel concepts of this invention and as set forth in the appended claims.

Having thus described my invention, I claim:

1. A tuning means for tuning within predetermined frequency bands comprising: a housing, a bore in said housing, a transmission line of predetermined electrical length retained within said bore, said transmission line including a first tab, said tab electrically coupled to said housing, rotatable means coupled to nib means, said rotatable means for rotatably displacing said nib means, said nib means including contact means riding on said transmission line and the surface of said bore, said nib means electrically coupling said transmission line to said bore, rotatable displacement of said nib means varying said electrical length of said transmission line thereby coarse tuning said tuning means within said frequency band, an inductor assembly including a second tab of said transmission line, means including an inductor tab in predetermined relationship with said second tab of said transmission line, a shorting bar engaging said tabs in predetermined relationship, and means for displacing said shorting bar to fine tune said tuning means when said tuning means is coarse tuned.

2. A tuning means for tuning within predetermined frequency bands comprising: a housing, bore in said housing, a transmission line of predetermined electrical length retained within said bore, said transmission line including a first tab, said tab electrically coupled to said housing, rotatable means coupled to nib means, said rotatable means for rotatably displacing said nib means, said nib means including contact means riding on said transmission line and the surface of said bore, said nib means electrically coupling said transmission line to said bore, rotatable displacement of said nib means varying said electrical length of said transmission line thereby coarse tuning said tuning means within said frequency bands; an inductor assembly including a second tab of said transmission line, means including an inductor tab in predetermined relationship with said second tab of said transmission line, a shorting means slidably engaging said tabs in predetermined relationship, and means for slidably displacing said shorting means to fine tune said tuning means when said tuning means is coarsed tuned; and means coupling said tuning means to a tunable circuit, said coupling means matching impedances between said tuning means and tunable circuit.

3. A tuning means for tuning with predetermined frequency bands comprising: a housing, bore in said housing, a transmission line of predetermined electrical length retained within said bore, said transmission line including a first tab, said tab electrically coupled to said housing, rotatable means coupled to nib means, said rotatable means for rotatably displacing said nib means, said nib means including contact means riding on said transmission line and the surface of said bore, said nib means electrically coupling said transmission line to said bore, rotatable displacement of said nib means varying said electrical length of said transmission line thereby coarse tuning said tuning means within said frequency bands, an inductor assembly including a second tab of said transmission line, V-shaped means including an inductor tab in substantially spaced parallel relationship with said second tab of said transmission line, a shorting means slidably engaging said tabs in predetermined relationship, and means for slidably displacing said shorting means to fine tune said tuning means when said tuning means is coarsed tuned, and means coupling said tuning meas to a tunable circuit, said coupling means matching impedances between said tuning means and said tunable circuit.

4. A tuning means for tuning within predetermined frequency bands comprising: a housing; an axial bore in said housing; a circular guide means positioned within said bore, said guide means including a groove cut therein; a transmission line of predetermined electrical length having an edge retained within said groove of said guide means, said transmission line including a first tab, said tab electrically coupled to said housing; a rotatable means coupled to a nib means, said rotatable means for rotatably displacing said nib means, said nib means including contact means riding on said transmission line and the surface of said bore, said nib means electrically coupling said transmission line to said bore, rotatable displacement of said nib means varying said electrical length of said transmission line thereby coarse tuning said tuning means within said frequency bands; an inductor assembly including a second tab of said transmission line, a V-shaped means having a stator plate and an inductor tab in predetermined relationship with said second tab of said transmission line, a shorting bar slidably engaging said tab in predetermined relationship, and means for slidably displacing said shorting bar to fine tune said tuning means when said tuning means is coarse tuned; and a plurality of variable coupling capacitors coupling said tuning means to a tunable circuit, said coupling capacitors for matching impedances between said tuning means and said tunable circuit.

5. A tuning means for tuning within predetermined frequency bands comprising: a housing; an axial bore in said housing; a circular guide means positioned within said bore, said guide means including a groove cut therein; a transmission line of predetermined electrical length having an edge retained within said groove of said guide means, said transmission line including a first tab, said tab electrically coupled to said housing; a rotatable means coupled to a nib means, said rotatable means for displacing said nib means, said nib means including contact means riding on said transmission line and the surface of said bore, said nib means electrically coupling said transmission line to said bore, rotatable displacement of said nib means varying said electrical length of said transmission line thereby coarse tuning said tuning means within said frequency bands; an inductor assembly including a second tab of said transmission line, a V-shaped means having a stator plate and an inductor tab in predetermined relationship with said second tab of said transmission line, a shorting bar slidably engaging said tabs in predetermined relationship, and means for slidably displacing said shorting bar to fine tune said tuning means when said tuning means is coarse tuned to a low frequency; a trimmer capacitor means including said stator plate of said V-shaped means and a vertically displaceable rod having a flat head portion juxtapositioned said stator plate, vertical displacement of said rod varying the capacitance of said trimmer capacitor thereby fine tuning said tuning means when said tuner is coarse tuned to a high frequency; and a plurality of variable coupling capacitors coupling said tuning means to a tunable circuit, said coupling capacitors for matching impedances between said tuning means and said tunable circuit.

6. A tuning means for tuning within the V.H.F. and U.H.F. frequency bands comprising: a housing; an axial bore in said housing; a circular guide means positioned within said bore, said guide means including an arcuate groove cut therein; an arcuately shaped transmission line of predetermined electrical length having an edge retained within said arcuate groove of said guide means, said transmission line including a first tab formed perpendicular to the periphery of said transmission line, said tab electrically coupled to said housing; a rotatable means coupled to a nib means, said rotatable means for rotatably displacing said nib means, said nib means including contact means riding on said transmission line and the surface of said bore, said nib means electrically coupling said transmission line to said bore, rotatable displacement of said nib means varying said electrical length of said transmission line thereby coarse tuning said tuning means within said frequency bands; an inductor assembly including a second tab of said transmission line, a V-shaped means having a stator plate and an inductor tab in spaced parallel relationship with said second tab of said transmission line, a U-shaped shorting bar slidably engaging said tabs in spaced parallel relationship, said means for slidably displacing said U-shaped shorting bar to fine tune said tuning means when said tuning means is coarse tuned to a low frequency; and a trimmer capacitor means including said stator plate of said V-shaped means and a vertically displaceable rod having a flat head portion overlaying said stator plate, vertical displacement of said rod varying the capacitance of said trimmer capacitor thereby fine tuning said tuning means when said tuner is coarse tuned to a high frequency.

7. A tuning means for tuning within the V.H.F. and U.H.F. frequency bands comprising: a housing; an axial bore in said housing; a circular guide means positioned within said bore, said guide means including an arcuate groove cut therein; an arcuately shaped transmission line of predetermined electrical length having an edge retained within said arcuate groove of said guide means, said transmission line including a first tab formed perpendicular to the periphery of said transmission line, said tab electrically coupled to said housing; a rotatable means coupled to a nib means, said rotatable means for rotatably displacing said nib means, said nib means including contact means riding on said transmission line and the surface of said bore, said nib means electrically coupling said transmission line to said bore, rotatable displacement of said nib means varying said electrical length of said transmission line thereby coarse tuning said tuning means within said frequency bands; an inductor assembly including a second tab of said transmission line, a V-shaped means having a stator plate and an inductor tab in spaced parallel relationship with said second tab of said transmission line, a U-shaped shorting bar slidably engaging said tabs in spaced parallel relationship, and means for slidably displacing said U-shaped shorting bar to fine tune said tuning means when said tuning means is coarse tuned to a low frequency; a trimmer capacitor means including said stator plate of said V-shaped means and a vertically displaceable rod having a flat head portion overlaying said stator plate, vertical displacement of said rod varying the capacitance of said trimmer capacitor thereby fine tuning said tuning means when said tuner is coarse tuned to a high frequency; and a plurality of variable coupling capacitors coupling said tuning means to a tunable circuit, said coupling capacitors for matching impedances between said tuning means and said tunable circuit.

8. A tuning means for tuning within predetermined frequency bands comprising: a housing; an axial bore in said housing; a circular guide means positioned within said bore; an arcuately shaped transmission line of predetermined electrical length coupled to said guide means, said transmission line including a plurality of concentric sections; a rotatable means coupled to a nib means, said rotatable means for rotationally displacing said nib means, said nib means electrically coupling said plurality of concentric sections, rotational displacement of said nib means varying said electrical length of said transmission line thereby coarse tuning said tuning means within said frequency bands; and a trimmer capacitor means including a vertically displaceable rod fixedly coupled to one of said concentric sections of said transmission line, vertical displacement of said rod vertically displacing said one concentric section with respect to another of said concentric sections thereby varying the capacitance of said trimmer capacitor so as to fine tune said coarse tuned tuning means.

9. A tuning means for tuning within the V.H.F. and U.H.F. frequency bands comprising: a housing; an axial bore in said housing; a circular guide means positioned within said bore; an arcuately shaped transmission line of predetermined electrical length coupled to said guide means, said transmission line including two concentric sections; a rotatable means coupled to a nib means, said rotatable means for rotationally displacing said nib means, said nib means electrically coupling said two concentric sections, rotational displacement of said nib means varying said electrical length of said transmission line thereby coarse tuning said tuning means within said frequency bands; a trimmer capacitor means including a vertically displaceable rod having a head portion fixedly coupled to one of said concentric sections of said transmission line, vertical displacement of said rod, vertically displacing said one concentric section with respect to said other concentric section thereby varying the capacitance of said trimmer capacitor so as to fine tune said coarse tuned tuning means; and a plurality of variable coupling capacitors electrically coupling said tuning means to a tunable circuit, said coupling capacitors for matching impedances between said tuning means and said tunable circuit.

10. A tuning means for tuning within predetermined frequency bands comprising: a housing; an axial bore in said housing; a circular guide means positioned within said bore; an arcuately shaped transmission line of predetermined electrical length coupled to said guide means, said transmission line including a plurality of concentric sections; a rotatable means coupled to a nib means, said rotatable means for rotationally displacing said nib means, said nib means electrically coupling said plurality of concentric sections, rotational displacement of said nib means varying said electrical length of said transmission line thereby coarse tuning said tuning means within said frequency bands; a trimmer capacitor means including a vertically displaceable rod fixedly coupled to one of said concentric sections of said transmission, vertical displacement of said rod vertically displacing said one concentric section with respect to another of said concentric sections thereby varying the capacitance of said trimmer capacitor so as to fine tune said coarse tuned tuning means; and a plurality of variable coupling capacitors electrically coupling said tuning means to a tunable circuit, said coupling capacitors for matching impedances between said tuning means and said tunable circuit.

11. A tuning means for tuning within the V.H.F. and U.H.F. frequency bands comprising: a housing; an axial bore in said housing; a circular guide means positioned within said bore; an arcuately shaped transmission line of predetermined electrical length coupled to said guide means, said transmission line including two concentric sections, rotation displacement of said nib means vary-rotatable means for rotationally displacing said nib means, said nib means electrically coupling said two concentric sections, rotational displacement of said nib means varying said electrical length of said transmission line thereby coarse tuning said tuning means within said frequency bands; a trimmer capacitor means including a vertically displaceable rod fixedly coupled to one of said concentric sections of said transmission line, vertical displacement of said rod vertically displacing said one concentric section with respect to said other concentric section thereby varying the capacitance of said trimmer capacitor so as to fine tune said coarse tuned tuning means; and a plurality of variable coupling capacitors electrically coupling said tuning means to a tunable circuit, said coupling capacitors for matching impedances between said tuning means and said tunable circuit.

12. A tuning means for tuning within the V.H.F. and U.H.F. frequency bands comprising: a housing; an axial bore in said housing; a circular guide means positioned within said bore; an arcuately shaped transmission line of predetermined electrical length coupled to said guide means, said transmission line including two concentric sections; a rotatable means coupled to a nib means, said rotatable means for rotationally displacing said nib means, said nib means positioned between and electrically coupling said two concentric sections, rotational displacement of said nib means varying said electrical length of said transmission line thereby coarse tuning said tuning means within said frequency bands; a trimmer capacitor means including a vertically displaceable rod having a head portion fixedly coupled to one of said concentric sections of said transmission line, vertical displacement of said rod vertically displacing said one concentric section with respect to said other concentric section thereby varying the capacitance of said trimmer capacitor so as to fine tune said coarse tuned tuning means; and a plurality of variable coupling capacitors electrically coupling said tuning means to a tunable circuit, said coupling capacitors for matching impedances between said tuning means and said tunable circuit.

References Cited by the Examiner

UNITED STATES PATENTS

| | | | |
|---|---|---|---|
| 2,763,776 | 9/1956 | Bussard et al. | 334—43 X |
| 2,765,447 | 10/1956 | Hesse | 333—82 |
| 2,819,391 | 1/1958 | Reiches | 334—43 X |
| 3,154,755 | 10/1964 | Wegener | 333—82 X |
| 3,159,803 | 12/1964 | Czubiak et al. | 333—83 |

HERMAN KARL SAALBACH, *Primary Examiner.*

R. HUNT, E. LIEBERMAN, *Assistant Examiners.*